(12) United States Patent
Wong et al.

(10) Patent No.: US 7,696,808 B2
(45) Date of Patent: Apr. 13, 2010

(54) SLEW RATE CONTROL IN OUTPUT DRIVER

(75) Inventors: Shiah Siew Wong, Singapore (SG); Wee Sien Hong, Singapore (SG); Tien Yew Kang, Singapore (SG); Jing Sun, Singapore (SG)

(73) Assignees: Panasonic Corporation, Osaka (JP); Panasonic Semiconductor Asia Pte. Ltd., Singapore (SG)

( * ) Notice: Subject to any disclaimer, the term of this patent is extended or adjusted under 35 U.S.C. 154(b) by 0 days.

(21) Appl. No.: 11/949,903

(22) Filed: Dec. 4, 2007

(65) Prior Publication Data
US 2009/0140796 A1 Jun. 4, 2009

(51) Int. Cl.
*H03K 17/16* (2006.01)
(52) U.S. Cl. .................. 327/384; 327/108; 327/170
(58) Field of Classification Search ............ 327/108, 327/170, 387, 384, 380, 308; 326/83, 62
See application file for complete search history.

(56) References Cited

U.S. PATENT DOCUMENTS

| | | | | |
|---|---|---|---|---|
| 5,473,263 A * | 12/1995 | Mahmood | ............... | 326/27 |
| 6,268,772 B1 | 7/2001 | Chen | | |
| 6,281,730 B1 | 8/2001 | Vu | | |
| 6,288,563 B1 * | 9/2001 | Muljono et al. | ............ | 326/27 |
| 6,366,114 B1 * | 4/2002 | Liu et al. | ............ | 326/27 |

\* cited by examiner

*Primary Examiner*—Dinh T. Le
(74) *Attorney, Agent, or Firm*—Greenblum & Bernstein PLC

(57) ABSTRACT

A slew rate control circuit in output driver of switching circuit to prevent power ground undershoot is introduced. The gate capacitance of lower power transistor is first fast discharged to ensure the operation of the output signal. The gate capacitance of lower power transistor is then slowly discharged to limit OUT SLEW RATE. The gate capacitance of lower power transistor is further slowly discharged when the power ground level is below common ground. With above controlling, the gate voltage slew rate of lower power transistor is reduced when the lower power transistor is almost fully turned OFF. Therefore, undershoot at the power ground is avoided. Similar slew rate control circuit can also be derived in output driver of switching circuit to prevent PVCC overshoot.

8 Claims, 6 Drawing Sheets

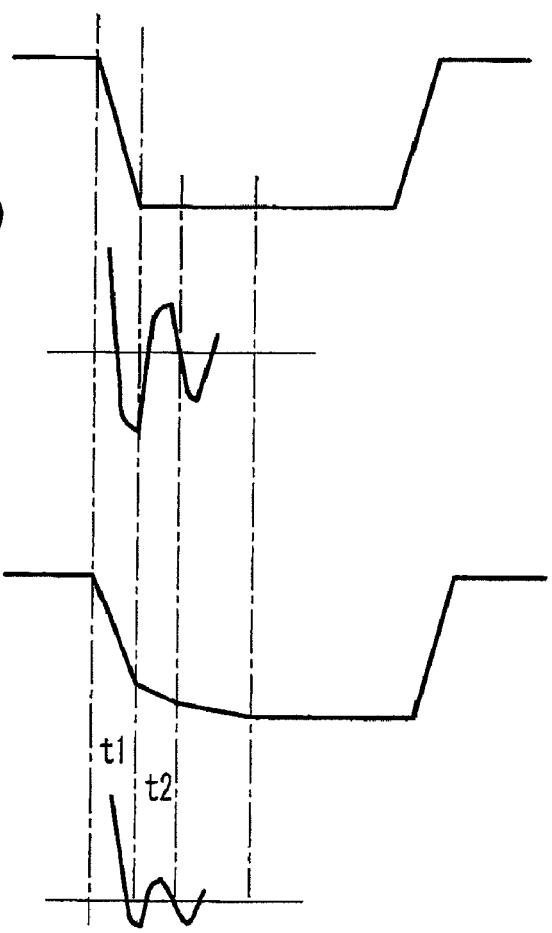

PVCC

Fig. 6C

VG1 (NEW)

Fig. 6D

PVCC (NEW)

SLEW RATE CONTROL IN OUTPUT DRIVER

BACKGROUND OF THE INVENTION

1. Field of Invention

The present invention relates to in general a switching mode audio power amplifier and, more particularly, to circuits and methods for power Vcc/Ground overshoot/undershoot prevention and slew rate control in switching mode circuits and systems.

2. Description of Related Art

Class D audio power amplifier is one type of switching circuit. Therefore, Class D audio power amplifier is chosen for illustration purpose. Most of the audio power amplifiers in the market are based on Class AB amplifier. This architecture offers very good total harmonic distortion plus noise (THD+N) performance, with fairly low quiescent current. However, the Class AB push-pull amplifiers are very inefficient and can only achieve an efficiency of about 60%, which results in not only power loss, but also additional bulky heatsink attached to the power amplifiers.

One major advantage of Class D amplifiers is the efficiency, which could reach above 90%. The high efficiency is achieved by full signal swing at power transistors. A typical Class D amplifier circuit 1000 is shown in FIG. 1, which includes a pulse width modulator 1010, an upper level shifter 1020, a lower level shifter 1030, a first pair of complementary transistors M30 and M40, which drives a first MOSFET switch M10, and a second pair of complementary transistors M50 and M60, which drives a second MOSFET switch M20.

Due to the large transistor size of power transistors, the gate parasitic capacitance is large. In case wire path from power transistors to power supply or power ground is long, the parasitic inductance originated from these wires is large. The bonding wires from connecting power supply pads and power supply pin and bonding wires connecting power ground pads and power ground pin are also long, the parasitic inductance originated from these wires is also large. These parasitic effects are demonstrated in FIG. 1 as CG10, CG20, L10 and L20. In the actual operation of Class D amplifier circuit 1000, in case of heavy load, large current is flowing through power transistor M10 and M20 in a complementary way. Let us just take L20 as an example. From physics equation, we know the voltage across PGND and DGND can be expressed as:

$$V(PGND - DGND) = L_{20} * \frac{di}{dt}$$

In case the circuit is heavily loaded, large switching current is flowing through lower power transistor M20. If M20 is turned off in a very short period, this large current is turned off as well. From above equation, we can predict that a large negative voltage is generated during this short period at power ground. For example, parasitic inductance L20 is assumed to be 0.1 nH, 10A current is turned off within a period of 1 ns, therefore, $$V(PGND - DGND) = 0.1 \times 10^{-9} * \frac{-10}{1 \times 10^{-9}} = -1V$$

It indicates that due to parasitic inductance on power ground wire, an undershoot voltage at power ground occurs with respect to digital ground when large current is quickly turned off at lower power transistor. FIGS. 5A and 5B show power ground undershoot in relation to fast slew rate of gate voltage of lower power transistor.

Undershoot at power ground causes noise, instability of the whole Class D amplifier circuit. Even worse, the Class D amplifier circuit is prone to latch-up when undershoot at power ground is large.

By observing the above equation, it is noticed that undershoot voltage at power ground is determined by 3 factors: parasitic inductance of power ground wire, current level at peak load and turn-off time of lower power transistor. To reduce undershoot at power ground, parasitic inductance of power ground wire can be reduced by increasing power ground wire width and shorten its length. However, this method increases chip size and its effect on parasitic inductance is not as significant as desired. Current level at peak load is a customer-defined parameter, which is not within the control of circuit designer. Turn-off time of lower power transistor is determined by parasitic gate capacitance of lower power transistor M20 and the size of discharging transistor M60. Parasitic gate capacitance CG20 is defined by customer-defined parameter efficiency and fabrication process, which is also not within the control of circuit designer. However discharging transistor M60 can be replaced with a self-adjusted discharging circuit, whose discharging speed is controlled by power ground voltage level. In other words, the slew rate of gate voltage at lower power transistor is controlled so that undershoot voltage at power ground is minimized.

SUMMARY OF THE INVENTION

The purpose of the present invention is to introduce a slew rate controlled output driver for lower power transistor so that the undershoot voltage of power ground with respect to common digital ground is minimized and to introduce a slew rate controlled output driver for upper power transistor so that the overshoot voltage of power VCC with respect to common VCC is minimized.

According to the present invention of a slew rate controlled output driver for lower power transistor, a slew rate controlled output driver is designed to replace widely used inverter type output driver. A slew rate controlled output comprises: an output level detector, which outputs a logic to control SW1 when output dc voltage rises to a predetermined value; a PGND level detector, which outputs a logic to control SW2 when power ground (PGND) drops to another predetermined value; a complementary transistors M5 and M6, which charges and discharges gate capacitance CG2 respectively; 2 switches SW1, SW2 and transistor M7, which discharge gate capacitance CG2 based on the output logic of output level detector and PGND level detector.

As apparent from the above, the slew rate controlled output driver for lower power transistor according to the present invention comprises an output level detector and a PGND level detector circuit. When output level rises to a predetermined value, output level detector outputs a logic signal to turn OFF SW1 so that discharge current for gate capacitance CG2 is reduced. When power ground (PGND) level is dropped to another predetermined value, PGND level detector outputs a logic signal to turn OFF SW2 so that discharge current for gate capacitance CG2 is further reduced. With the turning OFF of SW1 and SW2, the M2 gate voltage slew rate is reduced Correspondingly, the turn-off time for M2 is increased. Therefore, undershoot voltage of power ground is reduced.

According to the present invention of a slew rate controlled output driver for upper power transistor, a slew rate controlled output driver is designed to replace widely used inverter type output driver. A slew rate controlled output comprises: an output level detector, which outputs a logic to control SW1b when output dc voltage drops to a predetermined value; a PVCC level detector, which outputs a logic to control SW2b when power VCC (PVCC) rises to another predetermined value; a complementary transistors M3 and M4, which charges and discharges gate capacitance CG1 respectively; 2 switches SW1b, SW2b and transistor M7b, which discharge gate capacitance CG1 based on the output logic of output level detector and PVCC level detector.

According to the present invention, a slew rate controlled output driver for lower power transistor in an audio power amplifier comprises: a P-type MOSFET which turns on the power transistor by charging up its gate capacitance; a first N-type MOSFET which is small in size and provides a uninterrupted discharging path for the said gate capacitance of the said power transistor; a second N-type MOSFET which is big enough in size to turn off the said power transistor by discharging the said gate capacitance; a first switch whose turning-off reduces the discharging speed of the said gate capacitance from the path of the said second N-type MOSFET; a second switch whose turning-off further reduces the discharging speed of the said gate capacitance from the path of the said second N-type MOSFET; a output level detector which controls the said first switch; a PGND level detector which controls the said second switch.

According to the present invention, a slew rate controlled output driver for upper power transistor in an audio power amplifier comprises: a P-type MOSFET which turns on the power transistor by charging up its gate capacitance; a first N-type MOSFET which is small in size and provides a uninterrupted discharging path for the said gate capacitance of the said power transistor; a second N-type MOSFET which is big enough in size to turn off the said power transistor by discharging the said gate capacitance; a first switch whose turning-off reduces the discharging speed of the said gate capacitance from the path of the said second N-type MOSFET; a second switch whose turning-off further reduces the discharging speed of the said gate capacitance from the path of the said second N-type MOSFET; a output level detector which controls the said first switch; a PVCC level detector which controls the said second switch.

According to the present invention, a slew rate control method for lower power transistor output driver comprises: detecting the output signal level; turning off a first switch to slow down the discharge speed of the gate capacitance of the said power transistor; detecting the PGND level; turning off a second switch to further slow down the discharge speed of the said gate capacitance of the said power transistor;

According to the present invention, a slew rate control method for upper power transistor output driver comprises: detecting the output signal level; turning off a first switch to slow down the discharge speed of the gate capacitance of the said power transistor; detecting the PVCC level; turning off a second switch to further slow down the discharge speed of the said gate capacitance of the said power transistor;

According to the present invention, the slew rate of gate voltage of lower power transistor is controlled by output level and PGND level.

According to the present invention, the slew rate of gate voltage of lower power transistor is reduced when output level rises to a predetermined value.

According to the present invention, the slew rate of gate voltage of lower power transistor is further reduced when PGND level drops to another predetermined value.

According to the present invention, the reduction of slew rate makes PGND undershoot voltage smaller.

According to the present invention, the slew rate of gate voltage of upper power transistor is controlled by output level and PVCC level.

According to the present invention, the slew rate of gate voltage of upper power transistor is reduced when output level drops to a predetermined value.

According to the present invention, the slew rate of gate voltage of upper power transistor is further reduced when PVCC level rises to another predetermined value.

According to the present invention, the reduction of slew rate makes PVCC overshoot voltage smaller.

BRIEF DESCRIPTION OF THE DRAWINGS

FIGS. 5A and 5B are charts showing waveforms at major points in the slew rate controlled output driver for lower power transistor according to the prior art;

FIGS. 5C and 5D are charts showing waveforms at major points in the slew rate controlled output driver for lower power transistor according to the embodiment of the present invention;

FIGS. 6A and 6B are charts showing waveforms at major points in the slew rate controlled output driver for upper power transistor according to the prior art;

FIGS. 6C and 6D are charts showing waveforms at major points in the slew rate controlled output driver for upper power transistor according to the embodiment of the present invention;

DETAILED DESCRIPTION OF THE PREFERRED EMBODIMENTS

The following description explains the best mode embodiment of the present invention.

Figure 1:
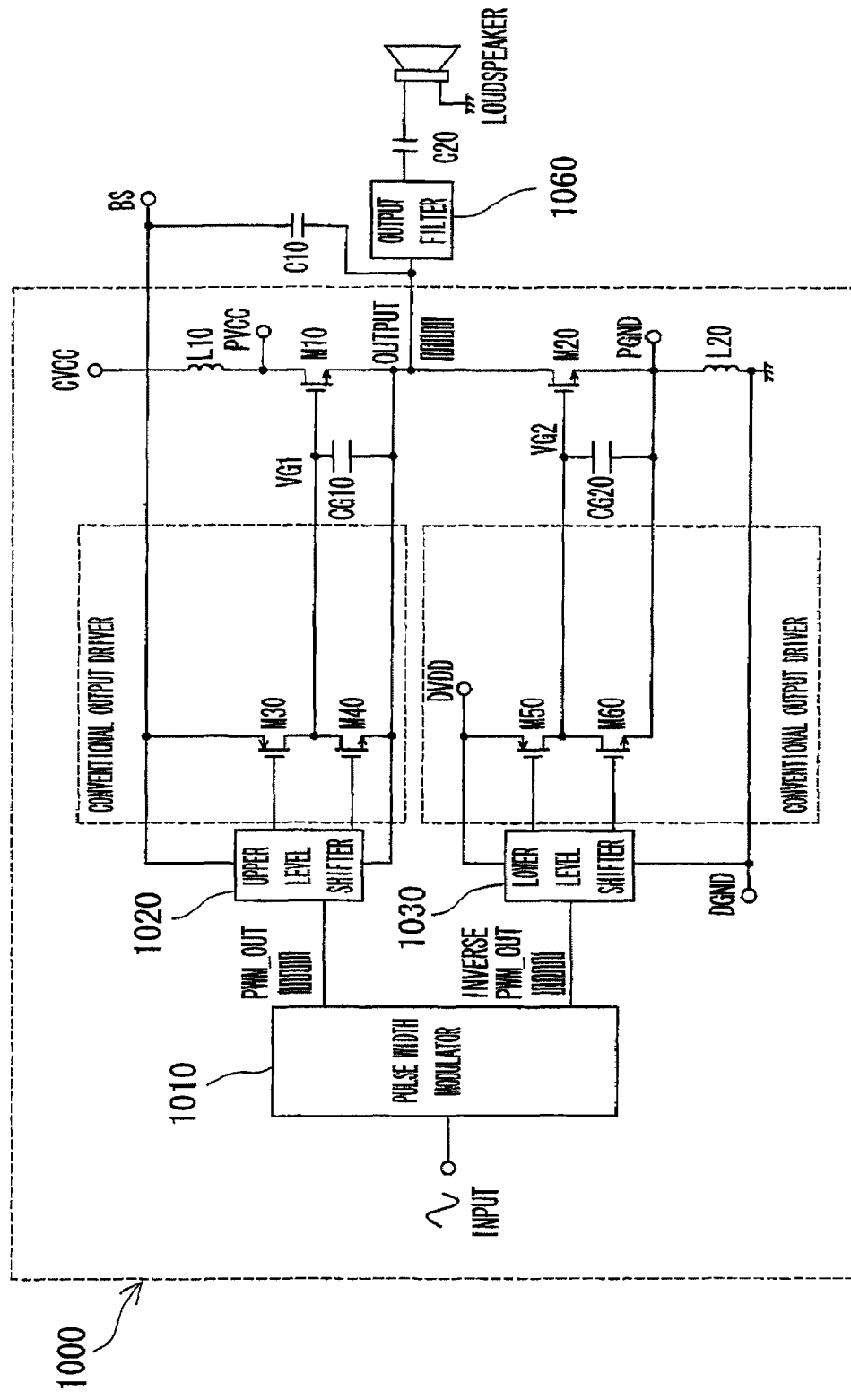
FIG. 1 is a block diagram showing an audio power amplifier with conventional output driver circuit according to the prior art.
Figure 2:
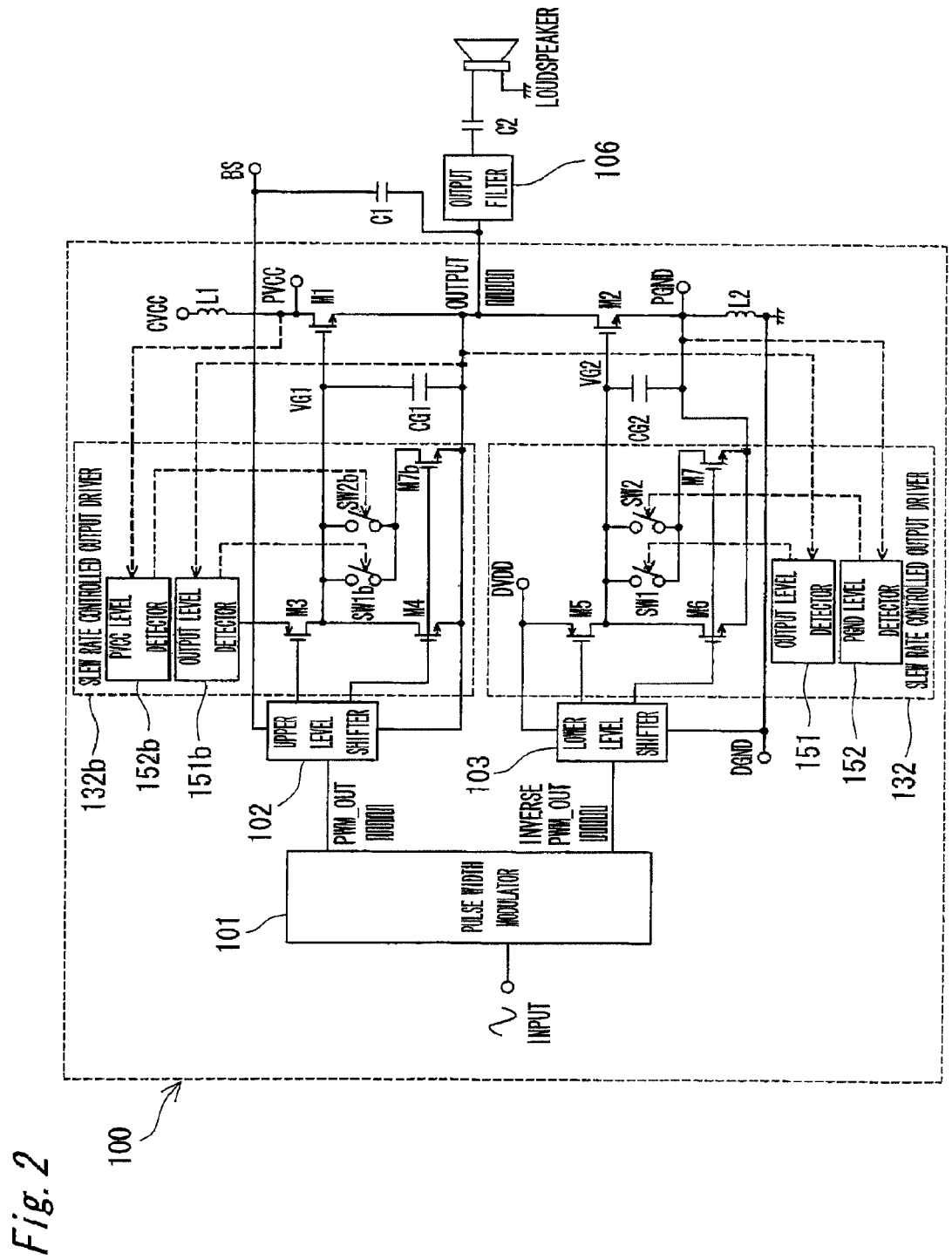
FIG. 2 is a block diagram showing an audio power amplifier with slew rate controlled output driver circuit for lower power transistor and slew rate controlled output driver circuit for upper power transistor according to the embodiment of the present invention.

Referring to FIG. 2, the embodiment of an audio power amplifier with slew rate controlled output driver 100, which is a Class D amplifier, is shown. The audio power amplifier with slew rate controlled output driver 100 comprises a pulse width modulator 101, a upper level shifter 102, a lower level shifter 103, a slew rate controlled output driver 132 to drive a second MOSFET switch M2, a slew rate controlled output driver 132b to drive a first MOSFET switch M1, whereas the slew rate controlled output driver 132 comprises a pair of complementary transistors M5, M6, two switches SW1, SW2, an output level detector 151, a PGND level detector 152 and a discharging transistor M7, and whereas the slew rate controlled output driver 132b comprises a pair of complementary transistors M3, M4, two switches SW1b, SW2b, an output level detector 151b, a PVCC level detector 152b and a discharging transistor M7b. The pulse width modulator 101, the upper level shifter 102, upper level shifter 103 define an audio signal passage for sending a pair of complementary pulse width modulation signals to output driver stage. The slew rate controlled output driver 132 drives the second MOSFET switches M2 and the slew rate controlled output driver 132b drives the first MOSFET switches M1 and L2 represents parasitic inductance of wire between common digital ground (DGND) and power ground (PGND), which is the source of second MOSFET switch M2. L1 represents parasitic inductance of wire between common power supply (CVCC) and driver power supply (PVCC), which is the drain of first MOSFET switch M1. CG2 is the parasitic gate capacitance of second MOSFET switch M2. CG1 is the parasitic gate capacitance of first MOSFET switch M1.

Figure 3:
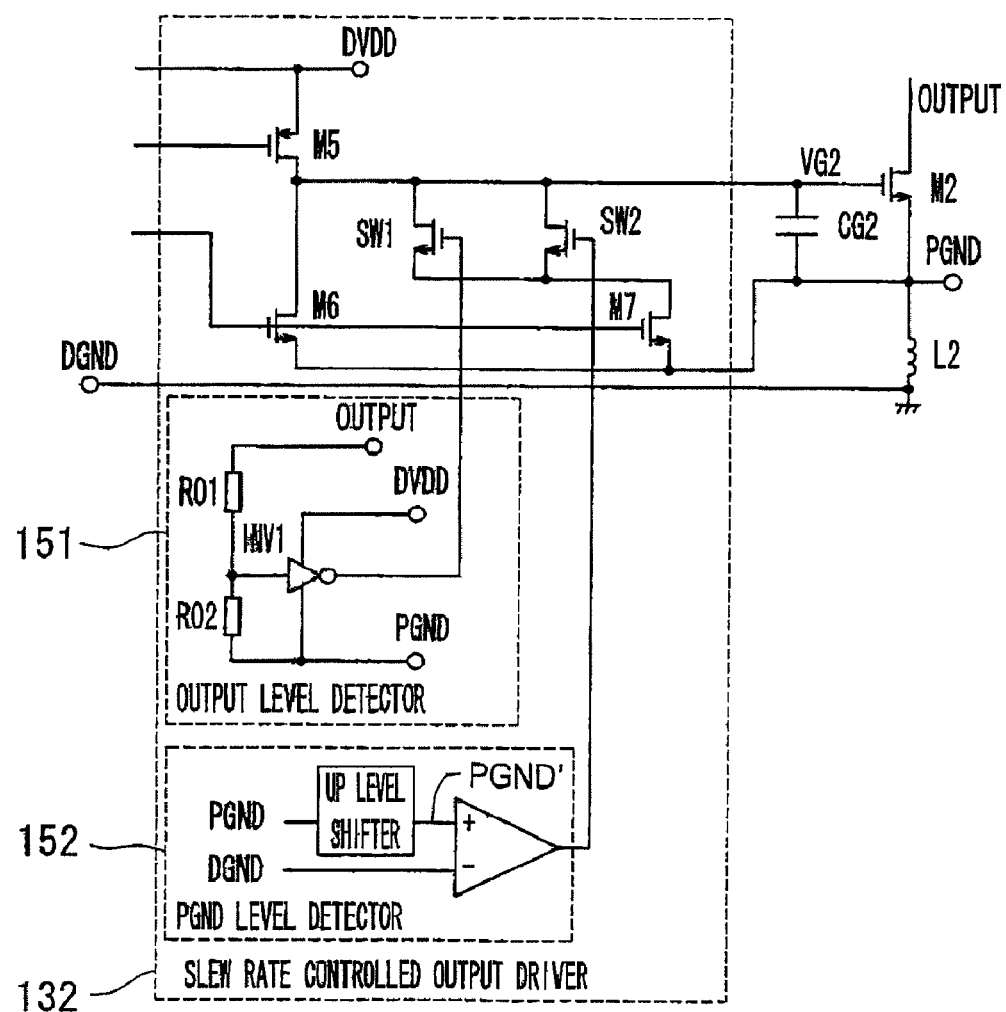
FIG. 3 is a block diagram showing slew rate controlled output driver for lower power transistor according to the embodiment of the present invention.

The slew rate controlled output driver 132 as shown in FIG. 2 comprises a pair of complementary transistors M5, M6, two switches SW1, SW2, an output level detector 151, a PGND level detector 152 and a discharging transistor M7. It not only provides drivability of PWM signal, but also changes the slew rate of the CG2 gate voltage at the output rising edge. The circuit implementation of output level detector 151 and PGND level detector 152 varies. One possible circuit implementation is illustrated in FIG. 3. It is observed that output level detector 151 simply comprises two resistors RO1 and RO2 and one inverter INV1. When final output voltage just starts rising towards power supply PVCC, the input voltage of INV1 is (VOUT*(RO2/(RO1+RO2))), which is designed to be logic low by proper setting of RO1 and RO2. Correspondingly, SW1 is turned ON which enable a fast discharge path of CG2. Falling slew rate of gate voltage VG2 is fast. When final output voltage rises to a predetermined value, the input voltage of INV1 is changed to logic high. Correspondingly, SW1 is turned off, which disables a fast discharge path of CG2. Falling slew rate of gate voltage VG2 is reduced. As VG2 further drops, final output voltage also further rises since second MOSFET switch M2 is almost turned OFF. In PGND level detector 152, after an Up Level Shifter, PGND' is compared with DGND. When minor undershoot occurs at PGND with respect to DGND, PGND level detector 152 outputs a logic low control to turn off SW2, which further disables fast discharge path of CG2. Falling slew rate of gate voltage VG2 is further reduced. Therefore, further large undershoot at PGND is avoided. FIGS. 5C and 5D show power ground undershoot in relation to reduced slew rate of gate voltage of lower power transistor.

The operations described above are summarized in Table 1 shown below.

TABLE 1

| Output Level Detector 151 | Rising state of output | Start | Predetermined value |
|---|---|---|---|
| | Input voltage of INV1 | Low | High |
| | SW1 | On | Off |
| | Falling slew rate of VG2 | Fast | Reduced |
| PGND Level Detector 152 | PGND' | >DGND | <DGND |
| | SW2 | On | Off |
| | Falling slew rate of VG2 | Fast | Reduced |

Figure 4:
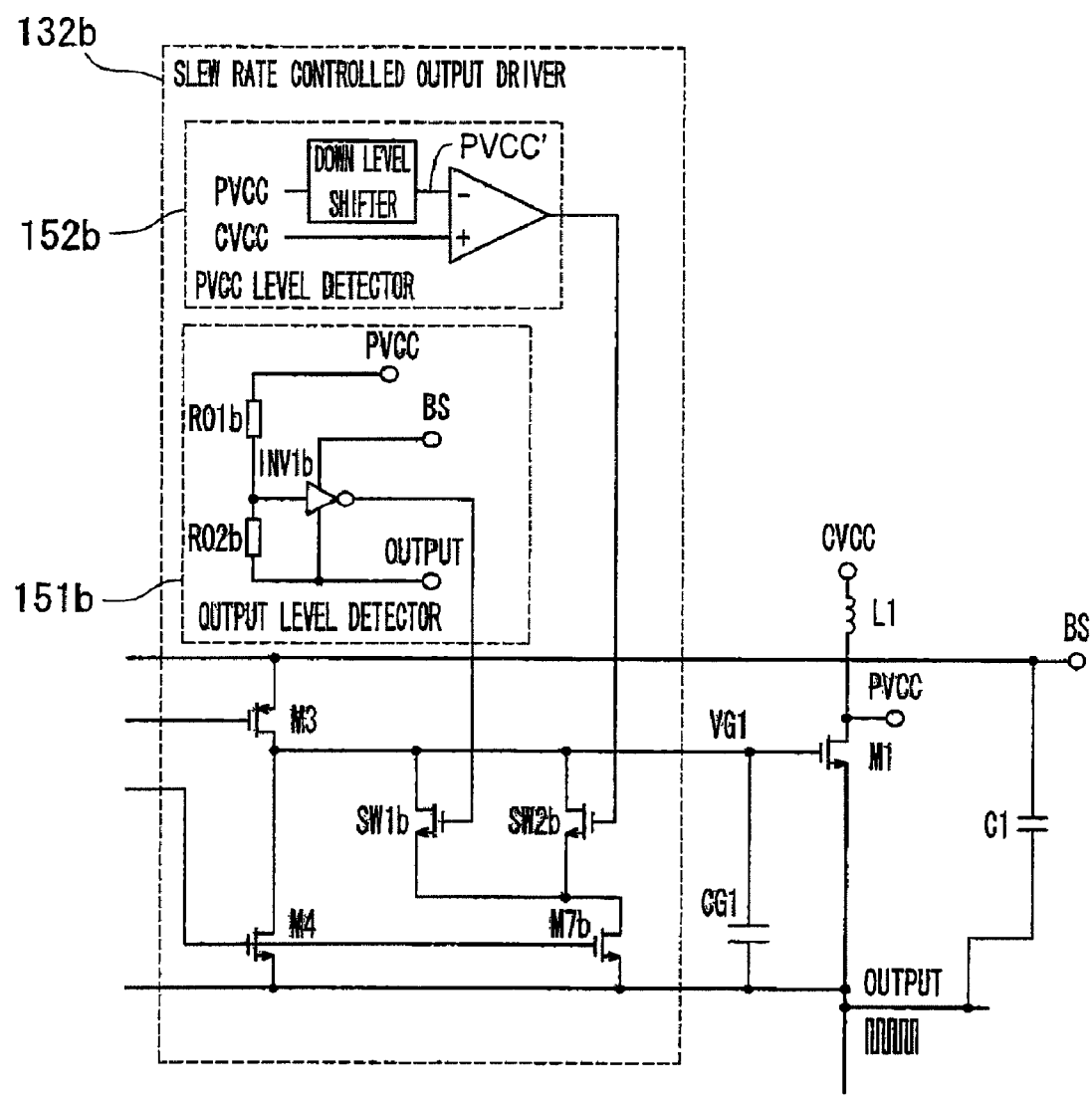
FIG. 4 is a block diagram showing slew rate controlled output driver for upper power transistor according to the embodiment of the present invention.

The slew rate controlled output driver 132b as shown in FIG. 2 comprises a pair of complementary transistors M3, M4, two switches SW1b, SW2b, an output level detector 151b, a PVCC level detector 152b and a discharging transistor M7b. It not only provides drivability of PWM signal, but also changes the slew rate of the CG1 gate voltage at the output falling edge. The circuit implementation of output level detector 151b and PVCC level detector 152b varies. One possible circuit implementation is illustrated in FIG. 4. It is observed that output level detector 151b simply comprises two resistors RO1b and RO2b and one inverter INV1b. When final output voltage just starts dropping towards power ground PGND, the input voltage of INV1b is (VOUT*(RO2b/(RO1b+RO2b))), which is designed to be logic low by proper setting of RO1 and RO2, Correspondingly, SW1b is turned ON which enable a fast discharge path of CG1. Falling slew rate of gate voltage VG1 is fast. When final output voltage drops to a predetermined value, the input voltage of INV1b is changed to logic high. Correspondingly, SW1b is turned off, which disables a fast discharge path of CG1. Falling slew rate of gate voltage VG1 is reduced. As VG1 further drops, final output voltage also further drops since first MOSFET switch M1 is almost turned OFF. In PVCC level detector 152, after a Down Level Shifter, PVCC' is compared with CVCC. When minor overshoot occurs at PVCC with respect to CVCC, PVCC level detector 152b outputs a logic low control to turn off SW2b, which further disables fast discharge path of CG1. Falling slew rate of gate voltage VG1 is further reduced. Therefore, further large overshoot at PVCC is avoided. FIGS. 6C and 6D show power supply overshoot in relation to reduced slew rate of gate voltage of upper power transistor.

The operations described above are summarized in Table 2 shown below.

TABLE 2

| Output Level Detector 151b | dropping state of output | Start | Predetermined value |
|---|---|---|---|
| | Input voltage of INV1b | Low | High |
| | SW1b | On | Off |
| | Falling slew rate of VG1 | Fast | Reduced |
| PVCC Level Detector 152b | PVCC' | <CVCC | >CVCC |
| | SW2b | On | Off |
| | Falling slew rate of VG1 | Fast | Reduced |

According to the present invention, the slew rate of gate voltage of lower power transistor is controlled by output level and PGND level.

According to the present invention, the slew rate of gate voltage of lower power transistor is reduced when output level rises to a predetermined value.

According to the present invention, the slew rate of gate voltage of lower power transistor is further reduced when PGND level drops to another predetermined value.

According to the present invention, the reduction of slew rate makes PGND undershoot voltage smaller.

According to the present invention, the slew rate of gate voltage of upper power transistor is controlled by output level and PVCC level.

According to the present invention, the slew rate of gate voltage of upper power transistor is reduced when output level drops to a predetermined value.

According to the present invention, the slew rate of gate voltage of upper power transistor is further reduced when PVCC level rises to another predetermined value.

According to the present invention, the reduction of slew rate makes PVCC overshoot voltage smaller.

What is claimed is:

1. A slew rate controlled output driver for a lower power transistor coupled between a power ground terminal and an output terminal in an audio power amplifier, comprising:
   a P-type MOSFET that is connected to a power source and a gate of the lower power transistor and turns on the power transistor by charging up a gate capacitance of the power transistor;
   a first N-type MOSFET, coupled between the gate of the lower power transistor and the power ground terminal, that provides an uninterrupted discharging path for the gate capacitance of the power transistor;
   a second N-type MOSFET that is adequate to turn off the power transistor by discharging the gate capacitance;
   a first switch between the gate of the lower power transistor and the second N-type MOSFET, wherein turning-off of the first switch reduces a discharging speed of the gate capacitance from a path of the second N-type MOSFET;
   a second switch between the gate of the lower power transistor and the second N-type MOSFET, wherein turning-off of the second switch further reduces the discharging speed of the gate capacitance from the path of the second N-type MOSFET;
   an output level detector, coupled to the output terminal, that controls the first switch, and is activated when an output level of the output driver rises above a predetermined value; and
   a power ground (PGND) level detector, coupled to the power ground terminal, that controls the second switch, and is activated when a power ground level drops below another predetermined value.

2. The output driver according to claim 1, wherein said first switch is turned off upon the activation of the output level detector.

3. The output driver according to claim 1, wherein said second switch is turned off upon the activation of the PGND level detector.

4. A slew rate controlled output driver for an upper power transistor coupled between a power source and an output terminal in an audio power amplifier comprising:
   a P-type MOSFET that is connected to the power source and a gate of the upper power transistor and turns on the power transistor by charging up a gate capacitance of the power transistor;
   a first N-type MOSFET, coupled between the gate of the upper power transistor and the output terminal, that provides an uninterrupted discharging path for the said gate capacitance of the power transistor;
   a second N-type MOSFET, coupled between the gate of the upper power transistor and the output terminal, that turns off the power transistor by discharging the gate capacitance;
   a first switch between the gate of the upper power transistor and the second N-type MOSFET, wherein turning-off of the first switch reduces discharging speed of the gate capacitance from path of the second N-type MOSFET;
   a second switch between the gate of the upper power transistor and the second N-type MOSFET, wherein turning-off of the second switch further reduces the discharging speed of the gate capacitance from the path of the second N-type MOSFET;
   an output level detector, coupled to the output terminal, that controls the first switch, and is activated when an output level of the output driver drops below a predetermined value; and
   a power supply (PVCC) level detector, coupled to the power source terminal, that controls the second switch, and is activated when a PVCC level rises above another predetermined value.

5. The output driver according to claim 4, wherein said first switch is turned off upon the activation of the output level detector.

6. The output driver according to claim 4, wherein said second switch is turned off upon the activation of the PVCC level detector.

7. A slew rate control method for controlling a lower power transistor coupled between an output terminal and a power ground terminal, the lower power transistor having a gate capacitance charged by a PMOS transistor coupled between the power source and the gate of the lower power transistor and being discharged by a NMOS transistor coupled between the gate and the power ground terminal, the method comprising:
   detecting an output signal level of the output terminal using an output level detector coupled to the output terminal;
   turning off a first switch, coupled between the gate of the lower power transistor and the power ground terminal, to slow down the discharge speed of the gate capacitance of the power transistor, when the detected output signal level rises above a predetermined value;
   detecting a power ground (PGND) level using a power ground level detector coupled to the power ground terminal;
   turning off a second switch, coupled between the gate of the lower power transistor and the power ground terminal, to further slow down the discharge speed of the gate capacitance of the power transistor, when the detected PGND level drops below another predetermined value.

8. A slew rate control method for controlling an upper power transistor coupled between an output terminal and a power source terminal, the upper power transistor having a gate capacitance charged by a PMOS transistor coupled between the power source and the gate of the upper power transistor and being discharged by a NMOS transistor coupled between the gate and the output terminal, the method comprising:
   detecting an output signal level of the output terminal using an output level detector coupled to the output terminal;
   turning off a first switch, coupled between the gate of the upper power transistor and the output terminal, to slow down the discharge speed of the gate capacitance of the power transistor, when the detected output signal level drops below a predetermined value;
   detecting a power supply (PVCC) level using a power supply level detector coupled to the power source terminal;
   turning off a second switch, coupled between the gate of the upper power transistor and the output terminal, to further slow down the discharge speed of the gate capacitance of the power transistor, when the detected PVCC level rises above another predetermined value.

* * * * *